(12) United States Patent
Simpson et al.

(10) Patent No.: US 11,209,730 B2
(45) Date of Patent: Dec. 28, 2021

(54) METHODS OF GENERATING DROP PATTERNS, SYSTEMS FOR SHAPING FILMS WITH THE DROP PATTERN, AND METHODS OF MANUFACTURING AN ARTICLE WITH THE DROP PATTERN

(71) Applicant: CANON KABUSHIKI KAISHA, Tokyo (JP)

(72) Inventors: Logan L. Simpson, Coupland, TX (US); Steven Wayne Burns, Austin, TX (US); Jason Battin, Pflugerville, TX (US); Niyaz Khusnatdinov, Round Rock, TX (US); Christopher Ellis Jones, Austin, TX (US); Craig William Cone, Austin, TX (US); Wei Zhang, Austin, TX (US); James W. Irving, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 201 days.

(21) Appl. No.: 16/353,433

(22) Filed: Mar. 14, 2019

(65) Prior Publication Data

US 2020/0292934 A1 Sep. 17, 2020

(51) Int. Cl.
*G03F 7/00* (2006.01)
*B29C 59/02* (2006.01)
(Continued)

(52) U.S. Cl.
CPC ........ *G03F 7/0002* (2013.01); *B29C 35/0805* (2013.01); *B29C 59/022* (2013.01);
(Continued)

(58) Field of Classification Search
CPC ........ B29C 2035/0833; B29C 35/0805; B29C 59/022; B82Y 10/00; B82Y 40/00; G03F 7/0002
See application file for complete search history.

(56) References Cited

U.S. PATENT DOCUMENTS 6,936,194 B2 8/2005 Watts
7,157,036 B2 1/2007 Choi et al.
(Continued)

FOREIGN PATENT DOCUMENTS

JP 2013-004537 A 1/2013
JP 2013-069919 A 4/2013
(Continued)

*Primary Examiner* — Robert J Grun
(74) *Attorney, Agent, or Firm* — Daniel Ratoff

(57) ABSTRACT

One embodiment is a method that includes generating drop pattern information. The method may comprise receiving pattern information. The pattern information may include one or both of: a substrate pattern of a representative substrate; and a template pattern of a representative template. The method may further comprise receiving offset information about a particular substrate that is representative of a measured state of the particular substrate relative to a reference state. The drop pattern information may represent a plurality of positions to place droplets of formable material on the particular substrate. The method may further comprise outputting the drop pattern information that is representative of the formable material that fills a volume between the template and the particular substrate that is in the measured state and the formable material does not spread into a border region at an edge of the particular substrate.

19 Claims, 7 Drawing Sheets

(51) Int. Cl.
  *B29C 35/08*    (2006.01)
  *B82Y 40/00*    (2011.01)
  *B82Y 10/00*    (2011.01)

(52) U.S. Cl.
  CPC ....... *B29C 2035/0833* (2013.01); *B82Y 10/00* (2013.01); *B82Y 40/00* (2013.01)

(56) References Cited

U.S. PATENT DOCUMENTS

| | | |
|---|---|---|
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 8,946,093 B2 | 2/2015 | Mikami |
| 9,880,463 B2 | 1/2018 | Wakabayashi et al. |
| 2009/0115110 A1 | 5/2009 | Schumaker |
| 2010/0173033 A1 | 7/2010 | Bailey et al. |
| 2011/0031650 A1 | 2/2011 | McMackin et al. |
| 2015/0017329 A1 | 1/2015 | Fletcher et al. |
| 2016/0214312 A1 | 7/2016 | Hirano |
| 2017/0068161 A1 | 3/2017 | Stachowiak et al. |
| 2017/0282440 A1 | 10/2017 | Stachowiak et al. |
| 2017/0285479 A1 | 10/2017 | Stachowiak et al. |
| 2017/0287708 A1 | 10/2017 | Liu et al. |
| 2017/0371240 A1 | 12/2017 | Liu et al. |
| 2018/0164678 A1 | 6/2018 | Fletcher et al. |
| 2019/0163052 A1 | 5/2019 | Cone |
| 2020/0096863 A1 | 3/2020 | Ozturk et al. |

FOREIGN PATENT DOCUMENTS

| | | |
|---|---|---|
| JP | 2019-062164 A | 4/2019 |
| JP | 2019-067918 A | 4/2019 |
| WO | 2019/078060 A1 | 4/2019 |

550

METHODS OF GENERATING DROP PATTERNS, SYSTEMS FOR SHAPING FILMS WITH THE DROP PATTERN, AND METHODS OF MANUFACTURING AN ARTICLE WITH THE DROP PATTERN

BACKGROUND

Field of Art

The present disclosure relates to methods of generating drop patterns, systems for shaping films with the drop pattern, and methods of manufacturing an article with the drop pattern.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

A first embodiment, may be a method of generating drop pattern information. The method may comprise receiving pattern information. The pattern information may include one or both of: a substrate pattern of a representative substrate; and a template pattern of a representative template. The method may further comprise receiving offset information about a particular substrate that is representative of a measured state of the particular substrate relative to a reference state. The drop pattern information may represent a plurality of positions to place droplets of formable material on the particular substrate. The method may further comprise outputting the drop pattern information that is representative of the formable material that fills a volume between the template and the particular substrate that is in the measured state and the formable material does not spread into a border region at an edge of the particular substrate.

In an aspect of the first embodiment, the measured state may include information that is representative of a measured offset of the substrate pattern on the particular substrate relative to a reference position of the substrate pattern on the representative substrate.

In an aspect of the first embodiment, the measured offset may include one or more of: a distance along a first axis; a distance along a second axis; and angle of rotation that are representative of the measured offset of the substrate pattern to the reference position.

In an aspect of the first embodiment, the measured state may include information that is representative of dimensions of a non-yielding peripheral portion of the particular substrate.

In an aspect of the first embodiment, the measured state may include one or more of: a distance along a first axis, a distance along a second axis, a radius, an eccentricity, an out-of-roundness, a width of the border region, an inner border region profile.

In an aspect of the first embodiment, the pattern information may include pattern layout information that is representative of a division of the representative substrate into a plurality of full fields and a plurality of partial fields that surround the plurality of full fields and each partial field is bounded by the border region and by one or more of the full fields. Each full field among the plurality of full fields may represent a particular portion of the particular substrate that is to be imprinted with the template. Each partial field among the plurality of partial fields may represent a particular portion of the particular substrate that is to be imprinted with a portion of the template that intersects with the border region.

In an aspect of the first embodiment, generating the drop pattern information may comprise generating a full field drop pattern that represents a plurality of positions to place droplets of the formable material on a representative full field that fills a volume between the template and the representative full field and the formable material does not spread beyond the representative full field during imprinting. Generating the drop pattern information may further comprise generating a plurality of partial field drop patterns. Each partial field drop pattern may be generated by modifying the full field drop pattern based on the offset information to determine the intersection of the border region of the particular substrate with each partial field drop pattern.

In an aspect of the first embodiment, modifying the full field drop pattern to generate each partial drop pattern may include cropping the full field drop pattern at the intersection of the border region with each partial field on the particular substrate.

In an aspect of the first embodiment, modifying the full field drop pattern to generate each partial drop pattern further may include, in a region of the partial field that is adjacent to the border region, one or more of: adding droplets; removing droplets; and moving droplets.

In an aspect of the first embodiment, the pattern information may include pattern layout information that is representative of a division of the representative substrate into a plurality of full fields and a plurality of partial fields that surround the plurality of full fields and are bounded one side by intersection of the border region and by one or more of the full fields. Each full field among the plurality of full fields has a similar full pattern. Each partial field among the plurality of partial fields represents a particular portion of the particular substrate that has a portion of the full pattern that intersects with the border region.

In an aspect of the first embodiment, generating the drop pattern information may comprise generating a full field drop pattern that represents a plurality of positions to place droplets of the formable material on a representative full field that fills a volume between the template and the representative full field. Generating the drop pattern information may further comprise generating a plurality of partial field drop patterns. Each partial field drop pattern may be generated by modifying the full field drop pattern based on the offset information to determine the intersection of the border region of the particular substrate with each partial field drop pattern. The formable material may not spread into the border region during imprinting.

In an aspect of the first embodiment, modifying the full field drop pattern to generate each partial drop pattern may include cropping the full field drop pattern at the intersection of the border region with each partial field on the particular substrate.

In an aspect of the first embodiment, modifying the full field drop pattern to generate each partial drop pattern may further include, in a region of the partial field that is adjacent to the border region, one or more of: adding droplets; removing droplets; and moving droplets.

In an aspect of the first embodiment, the substrate pattern may be topography of the substrate to which the template is aligned during an imprinting process and the offset information includes a position of the substrate topography relative to one of a center of the particular substrate and a center of a layer on the substrate.

In an aspect of the first embodiment, the offset information may be based on one or more alignments of the template with the substrate pattern of the particular substrate in one or more full fields.

In an aspect of the first embodiment, one or both of the substrate pattern and the template pattern may be featureless.

In an aspect of the first embodiment, the measured state may include information that is representative of a measured extent of a topmost film on the particular substrate relative to a reference edge of the representative substrate.

A second embodiment, may be a method of manufacturing articles. The method of manufacturing articles may comprise generating drop pattern information. Generating the drop pattern may comprise receiving pattern information. The pattern information may include one or both of: a substrate pattern of a representative substrate; and a template pattern of a representative template. Generating the drop pattern may further comprise receiving offset information about a particular substrate that is representative of a measured state of the particular substrate relative to a reference state. The drop pattern information may represent a plurality of positions to place droplets of formable material on the particular substrate. Generating the drop pattern may further comprise outputting the drop pattern information that is representative of the formable material that fills a volume between the template and the particular substrate that is in the measured state and the formable material does not spread into a border region at an edge of the particular substrate. The method of manufacturing articles may further comprise dispensing formable material on the particular substrate in accordance with the drop pattern information. The method of manufacturing articles may further comprise contacting the formable material with the template. The method of manufacturing articles may further comprise curing the formable material under the template so as to form cured formable material on the substrate. The method of manufacturing articles may further comprise processing the substrate with the cured formable material so as to manufacture the articles.

A third embodiment, may be a system for shaping a film on a substrate. The system may comprise a template chuck configured to hold a template. The system may further comprise a substrate chuck configured to hold a particular substrate. The system may further comprise a processor configured to generate drop pattern information. Generating the drop pattern information may comprise receiving pattern information that includes one or both of: a substrate pattern of a representative substrate; and a template pattern of a representative template. Generating the drop pattern information may further comprise receiving offset information about the particular substrate that is representative of a measured state of the particular substrate relative to a reference state. The drop pattern information represents a plurality of positions to place droplets of formable material on the particular substrate. Generating the drop pattern information may further comprise outputting the drop pattern information that is representative of the formable material that fills a volume between the template and the particular substrate that is in the measured state and the formable material does not spread into a border region at an edge of the particular substrate. The system may further comprise a fluid dispenser configured to dispense formable material on the particular substrate in accordance with the drop pattern information. The system may further comprise a positioning system configured to contact the formable material with the template in the template chuck. The system may further comprise a curing system configured to cure the formable material under the template so as to form cured formable material on the substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
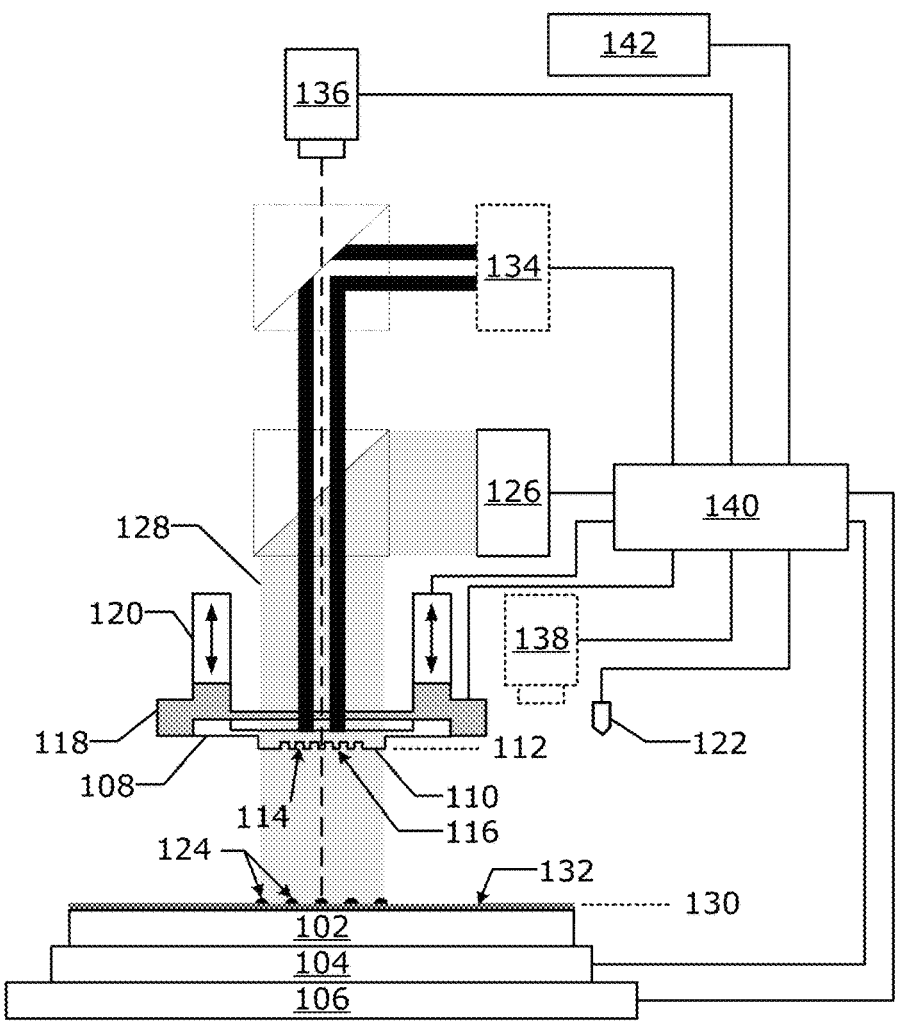
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The imprinting process may include dividing a substrate into multiple fields. One or more of the fields may then be imprinted by a template. The substrate may have a shape (which may be circular or some other shape) that does not accommodate exact tessellation with multiple fields (which may be rectangular or some other shape). In which case, the substrate may be divided into a plurality of full fields, which are surrounded by a plurality of partial fields.

The imprinting process also includes the generation of a drop pattern. A drop pattern may be a list of positions, sizes, and/or volumes of droplets of formable material that are deposited onto the substrate that fills the volume between the template and the substrate in each field, while not allowing formable material to leak out beyond the edge of each field, edge of template, and/or edge of substrate. The drop pattern may be generated based upon substrate pattern information and template pattern information. A fluid simulation method, and/or other simulation methods may be used to predict how a drop pattern will fill the volume between the template and the substrate. Experimental methods may also be used to generate the drop pattern.

The drop pattern for each full field may be substantially the same. In the context of the present invention each drop pattern being substantially the same is a design goal that is limited by the placement and volume accuracy of the fluid dispenser and the motion controller. The fluid dispenser 122 may have an accuracy between 0.01 μL for very small drops to 10 mL for very large drops. The stage controller may have an accuracy that is less than 1 nm for very precise placement of small drops to 10 mm for very large drops. While, the drop pattern for each partial field is a modified version of the full field drop pattern. For example, the partial fields may require partial field drop patterns that are "cropped" from full field drop patterns. The partial field drop patterns may be full field drop patterns that are cropped along a radius that corresponds to the substrate center and substrate radius minus the drop pattern substrate edge exclusion region. The applicant has found that if the partial field drop patterns are cropped along a radius that is not centered on the center of substrate but is offset by an amount specific to each substrate, then imprinting process produces better results. In an embodiment, the substrate radius refers to the edge of the patterned area of the substrate not including any beveled portion or the rounded off portion of the substrate.

The imprinting process may be just one step in a multi-step process that is used to generate multiple layers. All of the different layers need to be aligned with each other but are not necessarily aligned with the center of the substrate. Thus the first patterned layer on a substrate (L0 pattern) determines a preferred location of all subsequent layers. The applicant has found that the actual placement of the L0 pattern has some inherent variability relative to the substrate center. The applicant has also found that the substrate-to-substrate variability of L0 placement is large enough to require unique drop patterns cropped specifically for each partial field being imprinted. Thus, whereas imprinting with a given partial field drop pattern may be ideal for some substrates, it may cause, excess or insufficient formable material related defects on other substrates that have a different L0 placement on the substrate or a different substrate topography.

The applicant has also found that substrates may have geometry variation. For example a 300 mm diameter substrate may have a diameter tolerance of ±0.2 mm or ±0.02 mm. A substrate may also include notches, flat sides, or other features which aid in alignment and may need to be taken into account when generating partial field drop patterns.

Alternatively, an entire substrate may be imprinted all at once with a single template. One or both of the substrate and the template may have a repeating fields which is tiled across the substrate. In which case the full field drop patterns and partial field drop patterns are generated in the same manner as described above.

What is needed is a way to generate partial field drop patterns that takes into account the variation in one or both of the substrate and the position of a pattern on the substrate. The need is greatest when there are patterns on both the substrate and the template. There is also a need even if there are no features on the template and substrate due to geometry variations in one or both of the substrate and the template.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process. The field camera 136 may also be configured to measure interference fringes, which change as the formable material spreads 124 between the gap between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2:
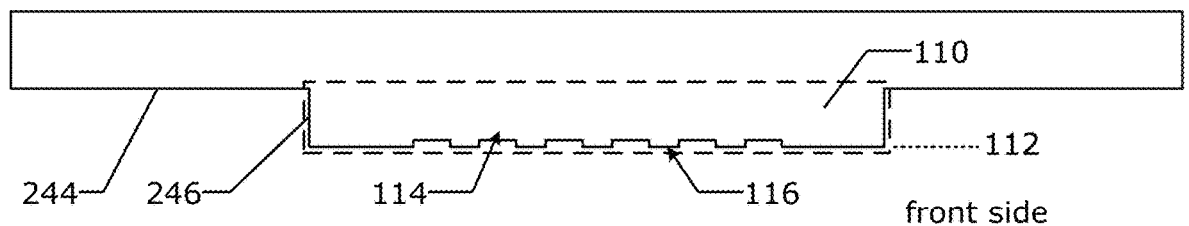
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
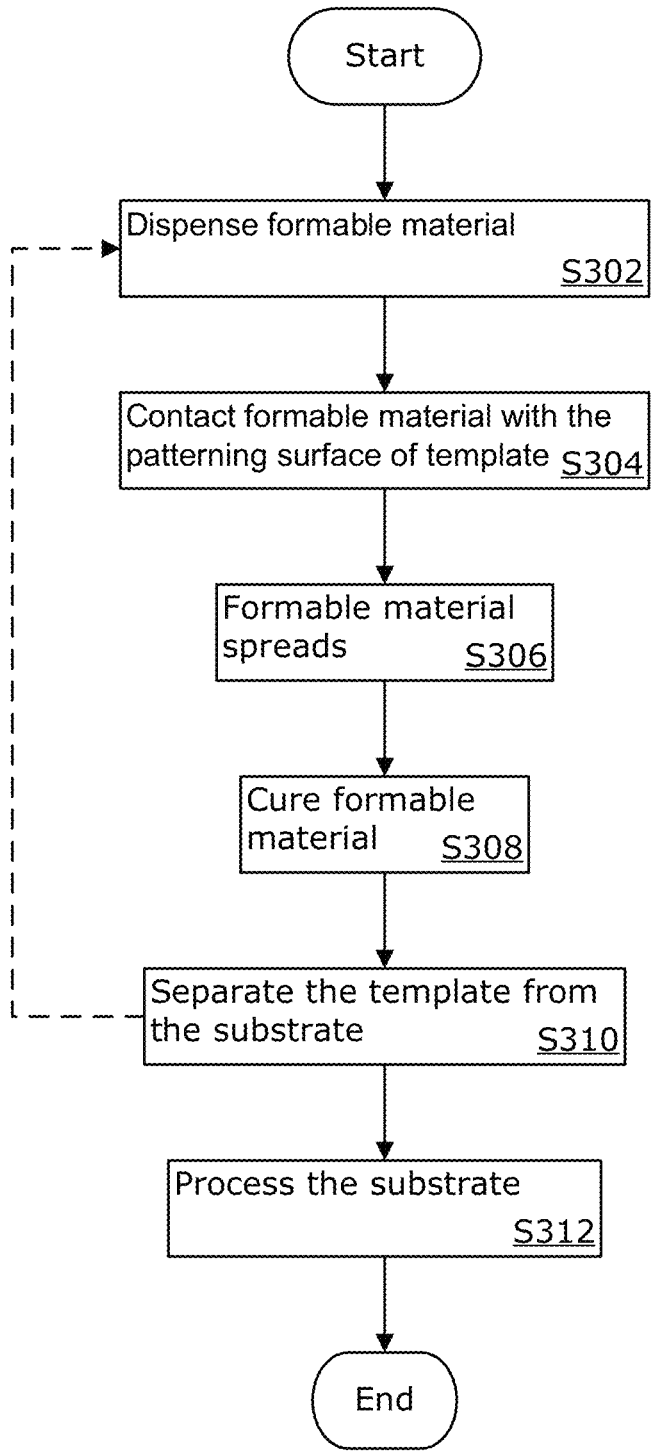
FIG. 3 is a flowchart illustrating an exemplary imprinting method as used in an embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, packaging, and the like. The substrate 102 may be processed to produce a plurality of articles (devices).

Field Layout

Figure 4A:
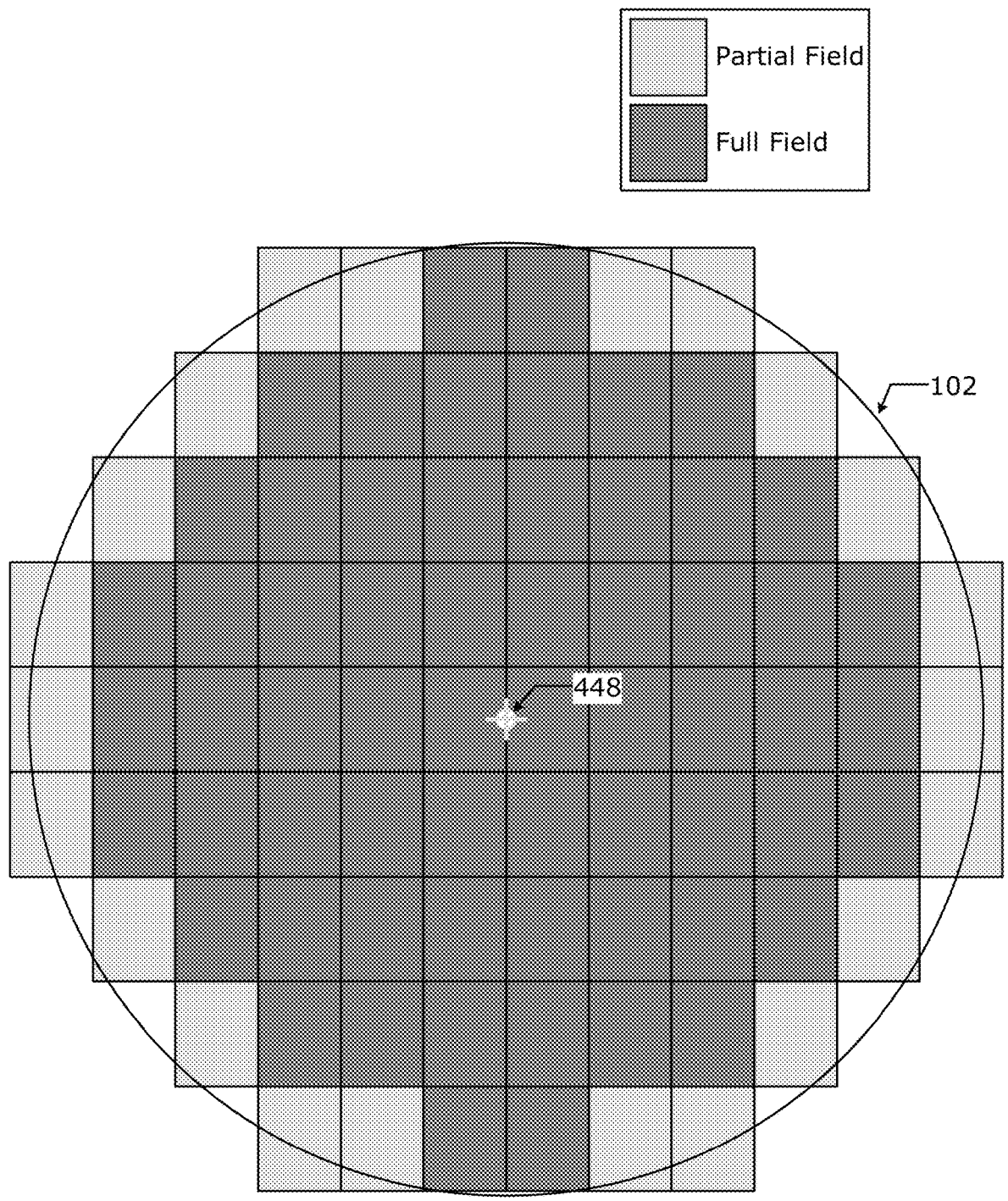
FIGS. 4A-B are illustrating exemplary substrates as used in an embodiment.

A single substrate may be used to produce 10 s to 10,000 s of identical devices. Turning a single substrate into multiple devices is a multi-step fabrication process. These fabrication processes may include whole substrate processes (for example: spin coating, planarization, whole wafer imprint lithography, etc.), scanning processes (for example: inspection, dicing, etc.), step and repeat processes (for example: imprint lithography, drop pattern dispensing, etc.). Step and repeat processes require that the substrate be divided into a plurality of fields. Each field may include one or many identical devices. The substrate may have a different shape then the field. When this is the case the substrate needs to be divided into a plurality of full fields and a plurality of partial fields. Each of the full fields may be identical to each other. The plurality of partial fields may surround the plurality of full fields and each partial field may be bounded by an edge of the substrate or a border region and by one or more of the full fields. FIG. 4A is an illustration of a representative circular substrate 102 with a center reference point 448. The circular substrate is divided into 84 representative rectangular fields including a plurality of full fields and a plurality of partial fields. In an alternative embodiment, one or more geometric shapes are used to tessellate a substrate.

Figure 4B:
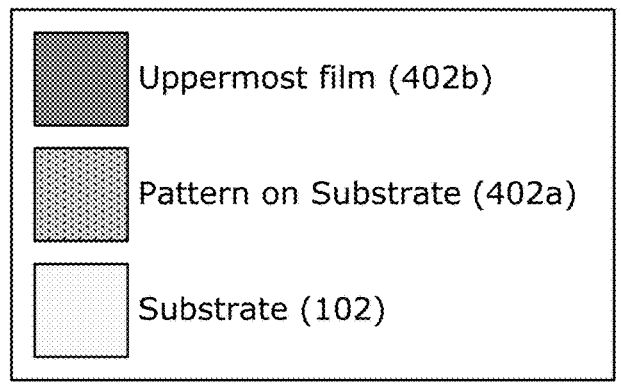
Figure 4B:
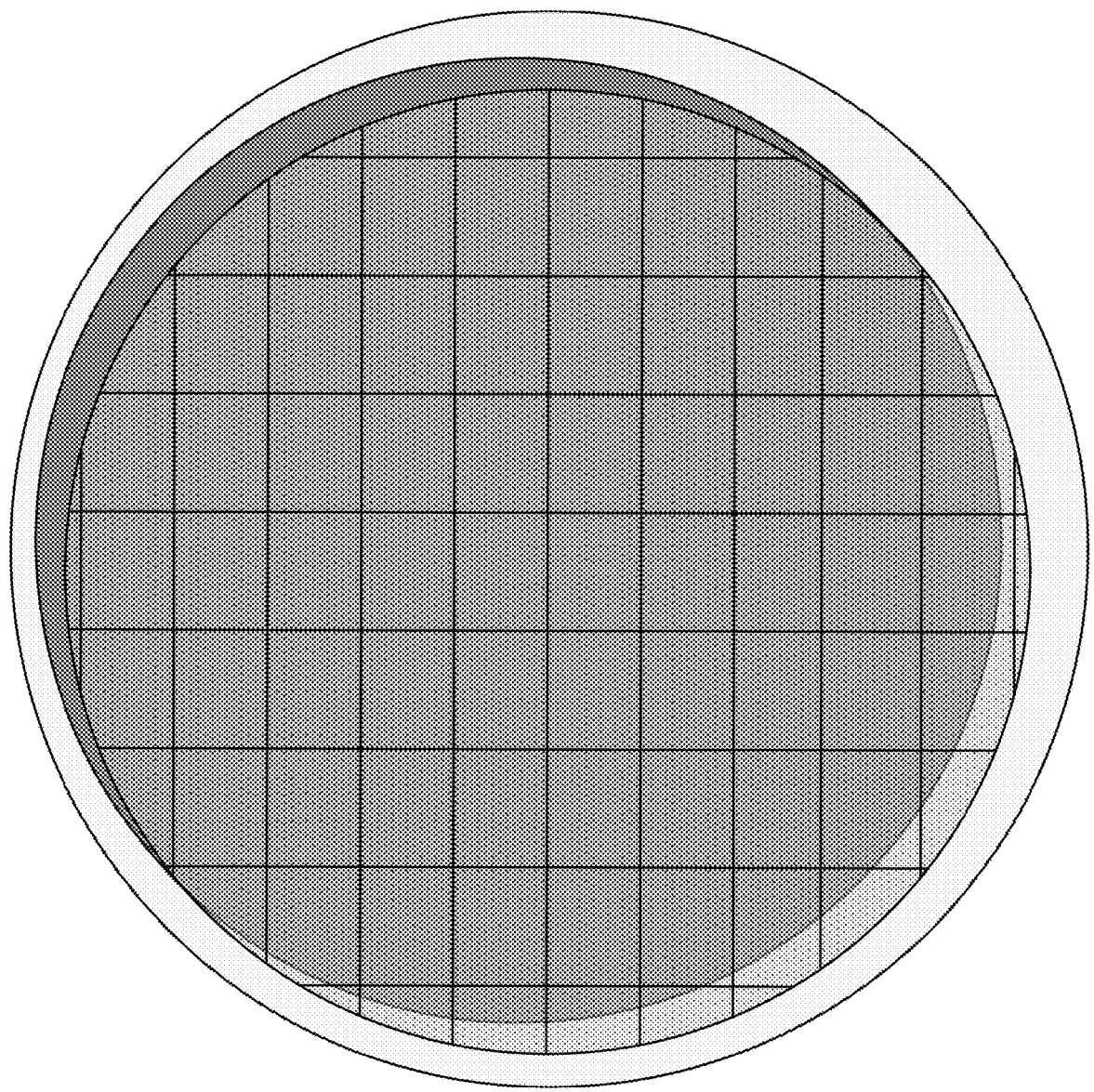

FIG. 4B is an illustration of an exemplary substrate 102 that includes a pattern 402a and an uppermost film 402b. These patterns may be doped regions, etched regions and/or other modifications to the underlying substrate that form or are used to form devices. The exemplary substrate 102 may also include one or more films of insulating material, metal, planarization material, resist, etc. that may or may not include a pattern. The applicant has determined that each of these patterns and films are not necessarily aligned with the center of the substrate as illustrated in FIG. 4B. The misalignment in FIG. 4B of the film and the pattern with the center of the substrate is exaggerated for illustrative purposes and may be on the order of 0.001 mm to 5 mm. The applicant has also determined that the radial extent of each of the films is also not necessarily aligned with center of the substrate or the underlying pattern.

Drop Pattern Generation

The applicant has found that it is useful to deposit a plurality of drops of formable material 124 onto a substrate 102 which is then imprinted. Imprinting may be done in a field by field basis or on a whole wafer basis. The drops of formable material 124 may also be deposited in a field by field basis or on a whole substrate basis. The applicant has found that even when the drops are deposited on a whole substrate basis generating the drop pattern is preferably done on a field by field basis.

Generating a drop pattern for a full field may include a processor 140 receiving: a substrate pattern of a representative substrate 102; and a template pattern of a representative template 102.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape such as a bevel, a rounding of an edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the same size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate surface, spatial variation in volume between the patterning surface and the substrate surface; fluid flow, evaporation; etc.

Figure 5A:
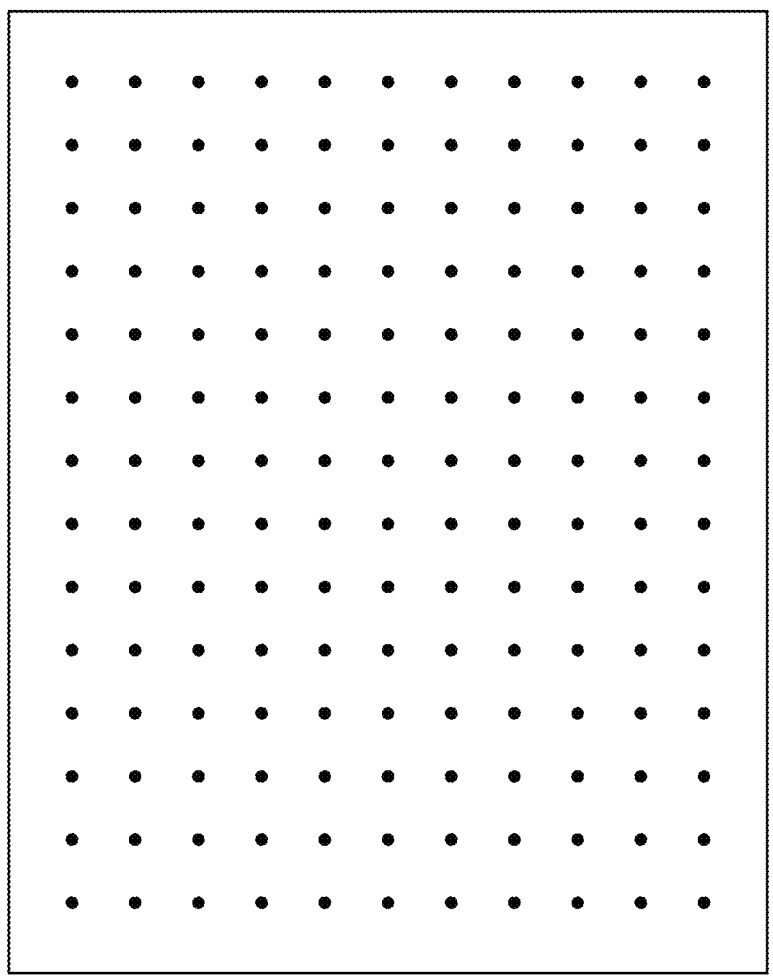
FIGS. 5A-C are illustrating exemplary drop pattern for full fields and partial fields as used in an embodiment.

In an embodiment, the calculation of the distribution of formable material takes advantage of the repeating nature of one or both of the substrate pattern and the template pattern to reduce the calculation time. For example, a full field drop pattern 550 may be calculated for a full field as illustrated in FIG. 5A. The full field drop pattern 550 illustrated in FIG. 5A is depicted as a regular array of droplets, a full field drop pattern 550 may be irregular, and may include just a few drops or many millions of drops.

In an embodiment, the full field drop pattern 550 represents a plurality of positions to place droplets of the formable material on a representative full field of the substrate surface 130 of the representative substrate. The full field drop pattern also fills a volume between the patterning surface 112 of the template 108 and the representative full field of the substrate surface 130. In the present context, filling a volume between the patterning surface 112 of the template 108 and the representative full field of the substrate surface 130 during the imprinting process is a design goal which may be met 0.001% to 10% of the time. The full field drop pattern also does not spread beyond the representative full field during an imprinting process. In the present context, not spreading beyond the representative full field during the imprinting process is a design goal which may be met 0.001% to 10% of the time. The full field drop pattern is generated so that the formable material 124 can fill the protrusions 116 and recesses 114 of the template 108 while not going beyond the mesa sidewalls 246 before being cured by actinic radiation. In an embodiment, outputting the drop pattern information may include sending the drop pattern information to one or more processors that then send instructions to one or more of the fluid dispenser 122 and one or more positioning stages. In an embodiment, outputting the drop pattern information may include saving the drop pattern information in a non-transitory computer readable memory which may then be used to send instructions to one or more of the fluid dispenser 122 and one or more positioning stages. In an embodiment, outputting the drop pattern information may include presenting the drop pattern information to an operator which may then approve sending instructions to one or more of the fluid dispenser 122 and one or more positioning stages.

Partial Field Drop Pattern Generation

Figure 5B:
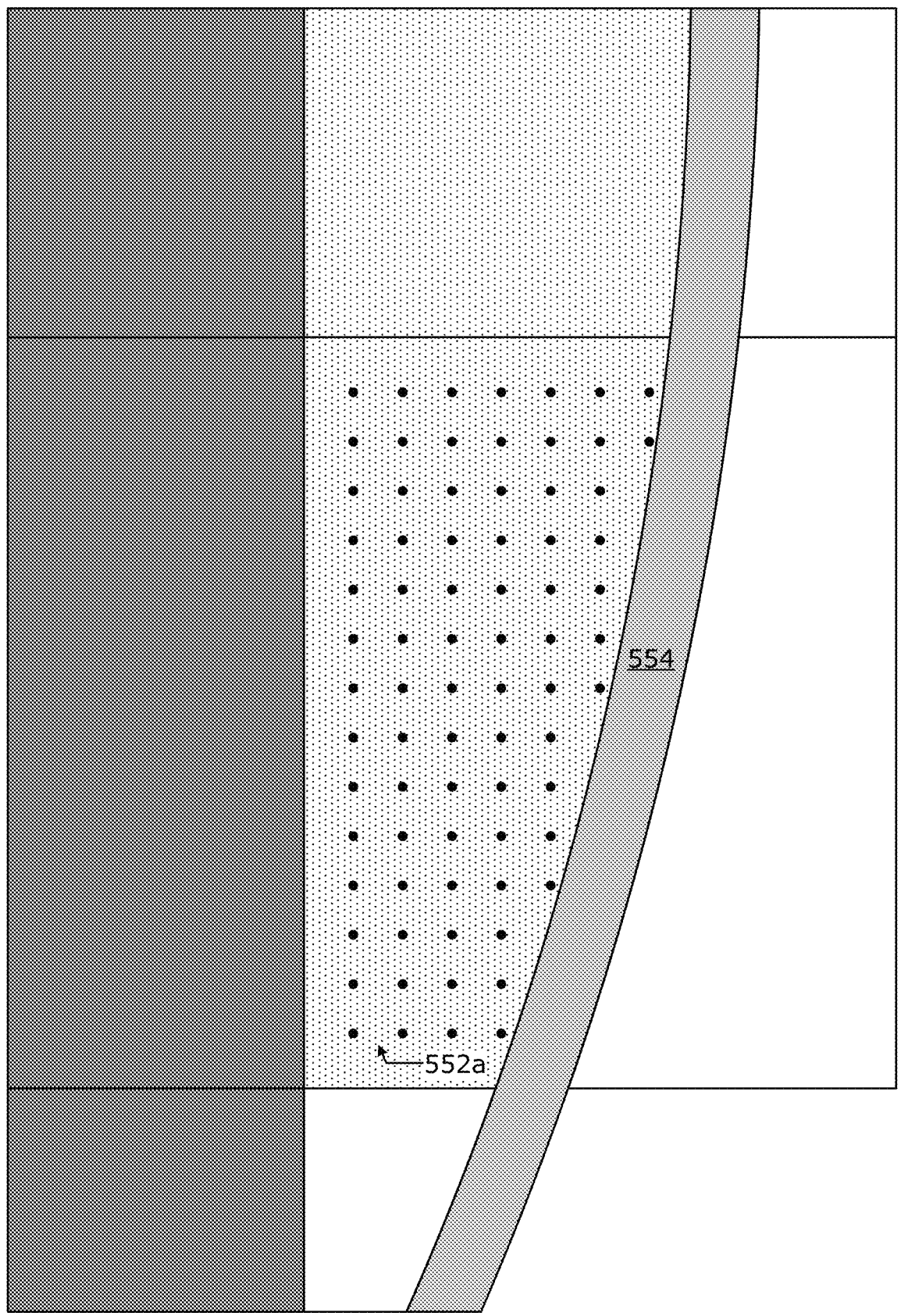

FIG. 5B is an illustration of how the full field drop pattern 550 may be cropped to form a particular partial field drop pattern 552a. Each partial field may be bounded by one or more full fields. Some of the partial fields may also be bounded by another partial field. Each partial field is also bounded by the edge of the substrate or a border region 554 at the edge of the substrate. In an embodiment, the partial field drop pattern 552a is a cropped version of the full field drop pattern 550 relative to border region 554 as illustrated in FIG. 5B. Drops which are in the border region 554 or outside the substrate are removed from the full field drop pattern thus forming the partial field drop pattern 552a. In an embodiment, modifying the full field drop pattern 550 to generate each partial drop pattern 552a further includes, in a region of the partial field that is adjacent to the border region 554, one or more of: adding droplets; removing droplets; and moving droplets. In an embodiment, the full field drop pattern 550 is modified such that the formable material 124 does not spread into the border region 554 of the particular substrate. In the context of the present disclosure, formable material 124 not spreading into the border region 554 of the particular substrate means that over some percentage (for example 90%, 99%, or 99.999%) of the border region 554, is a design goal. In an embodiment, generating each partial field drop pattern 552a may include simulating the spread of drops under the template in each partial field taking the measured state of the particular substrate into account.

Figure 5C:
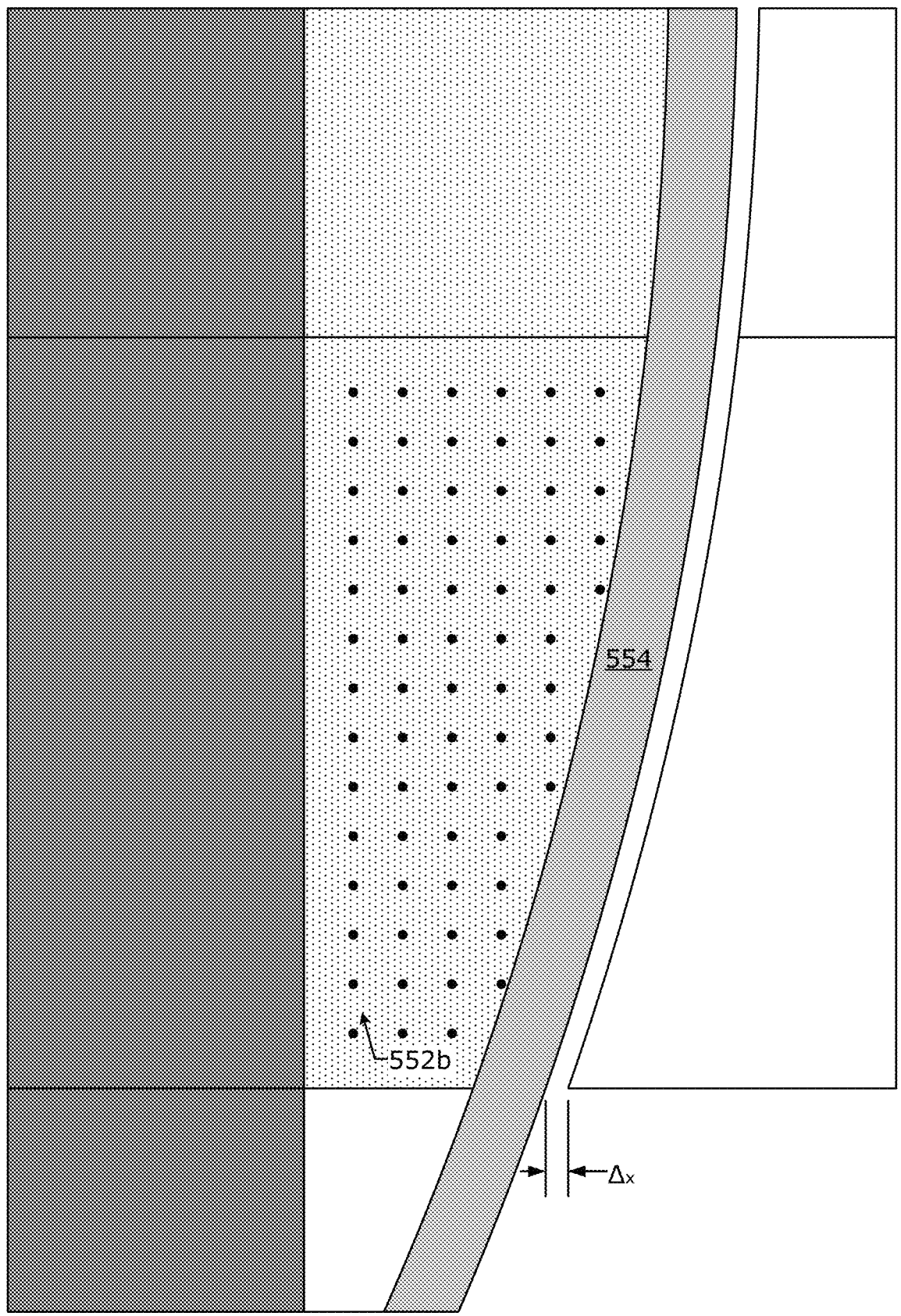

In an embodiment, a substrate may include an underlying pattern. The position of this underlying pattern relative for each particular substrate relative to a reference position can vary by: a distance $\Delta x$ along a first axis; distance $\Delta y$ along a second axis, and/or an angle $\Delta \theta$ of rotation. The second axis may be perpendicular to the first axis. FIG. 5C is an illustration of a particular partial field drop pattern 552b that has been generated to take into account an offset $\Delta x$ of the particular substrate relative to a reference position.

In an embodiment, each partial field drop pattern is adjusted based upon the measured state of the particular substrate. The unique attributes of the particular substrate may include offset information that is representative of a measured state of a particular substrate.

In an embodiment, the measured state of the substrate may include a location of an L0 pattern on the particular substrate. In an embodiment, the L0 pattern is the first pattern that is etched and/or added to the substrate upon which all subsequent patterns are aligned. In an embodiment, the measured state of the particular substrate is not known until immediately prior to imprinting. The partial field drop patterns for a particular substrate may then be generated only after the state of the particular substrate is measured. In an embodiment, the measured state of the substrate may include an extent of a topmost surface of a film on the particular substrate relative to a reference edge of a representative substrate. In an embodiment, the measured state of the substrate may include an extent of a one or more films on the particular substrate relative to a reference edge of a representative substrate and the location of one or more patterns on the particular substrate relative to a reference position on the representative substrate.

In an embodiment, offset information representative of an aspect of a state of the particular substrate is measured when a full field is imprinted as alignment marks on the template are aligned with alignment marks on the substrate. Alignment data from one or more full field imprints may then be used to generate offset information which can be used to determine the position of the border region 554 relative to particular partial fields. Thus, the partial field drop pattern 552a may be generated after one or more full fields are imprinted.

In an embodiment, the substrate topography is pre-measured and offset information is generated for a particular substrate by the pre-measurement which is then sent to the processor 140 and is then used to generate partial field drop patterns 552a. In an embodiment, the pre-measurement is performed with a surface profiler (for example a stylus based surface profiler or optical based surface profiler).

In an embodiment, the offset information that is representative of the measured state of the particular substrate includes information about a shape and position of a border region 554 of the particular substrate relative to an underlying pattern of the particular substrate and/or an imprinted full field. The shape of the border region 554 may take into account one or more of: an offset along a first axis of the particular substrate; an offset along a second axis of the particular substrate; a rotation offset of the particular substrate; a radius of the particular substrate and/or the inner edge of the border region; a diameter of the particular substrate and/or the inner edge of the border region; an eccentricity of the particular substrate and/or the inner edge of the border region; an out-of-roundness of the particular substrate and/or the inner edge of the border region; a width of the border region; an inner edge of the border region profile.

The shape of the inner edge of the border region may be determined by the shape of the substrate, the shape of edges of one or more patterned layers on the substrate, and/or the shape of edges of one or more unpatterned layers on the substrate. In an embodiment, a particular substrate may be subjected to processing steps which add one or more layers to the particular substrate. Each of these one or more layers may have an outer edge profile that is inset from within an edge of the substrate. The inner edge of the border region may also be inset within the edges of these underlying layers. In an embodiment, the shape of the inner edge of the border region may be determined by the extent of the uppermost film 402b on the substrate 102. In an embodiment, the shape of the inner edge of the border region may be determined by the extent the uppermost film on the substrate and the extent of a patterned layer on the substrate.

In an embodiment, the shape of the inner edge of the border region may be determined by the extent of multiple films on the substrate 102.

In an embodiment, modifying the full field drop pattern to generate each partial drop pattern may further include, in a region of the partial field that is adjacent to the border region, one or more of: adding droplets; removing droplets; and moving droplets. In an embodiment, generating the partial field drop pattern may include removing droplets from the full field drop pattern that are outside an inner edge of the border region and adding additional droplets near the border region so as to increase the thickness of the imprinted pattern near the border. In an embodiment, generating the partial field drop pattern may include removing droplets from the full field drop pattern that are outside an inner edge of the border region and moving droplets near the border region so as to modify the thickness of the imprinted pattern near the border. In an embodiment, generating the partial field drop pattern may include removing droplets from the full field drop pattern that are outside an inner edge of the border region and removing additional droplets that are near the border region so as to modify the thickness of the imprinted pattern near the border region.

Alignment

The imprinting process 300 may include an alignment process that is performed during one or more of steps S302, S304, S306. The alignment process may include measuring alignment marks on or more of: the particular substrate, the template; and the substrate chuck. In an embodiment, the alignment marks on the particular substrate define the positions of any underlying layers. Each full field may contain multiple alignment marks. The alignment process when used to imprint full fields can be used to generate offset information which can then be used to customize partial field droplet patterns. Statistical techniques such as averages and/or higher order statistics may be used combine information from multiple alignment marks across multiple full fields in order to determine the offset information. In an alternative embodiment, one or more alignment marks from one or more fields that are close to each partial field are used to determine the offset information. In an alternative embodiment, a weighted average of the one or more alignment marks from the one or more fields are used to determine the offset information. Wherein the weighting is determined based on a distance of the alignment mark and/or field from the particular partial field. In an alternative embodiment, outliers in the alignment data are not used to determine offset information.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising:
    receiving pattern information that includes one or both of:
        a substrate pattern of a representative substrate; and
        a template pattern of a representative template;
    receiving offset information about a particular substrate that is representative of a measured state of multiple of fields on the particular substrate relative to a reference state;

wherein drop pattern information represents a plurality of positions to place droplets of formable material onto a particular partial field of the particular substrate;

generating the drop pattern information that is representative of the formable material that fills a volume between a template and the particular substrate that is in the measured state and the formable material does not spread into a border region at an edge of the particular substrate; and depositing the formable material onto the particular partial field of the particular substrate based on the drop pattern information.

2. The method according to claim 1, wherein the measured state includes information that is representative of a measured offset of the substrate pattern on the particular substrate relative to a reference position of the substrate pattern on the representative substrate.

3. The method according to claim 2, wherein the measured offset includes one or more of a distance along a first axis, a distance along a second axis and angle of rotation that are representative of the measured offset of the substrate pattern to the reference position.

4. The method according to claim 1, wherein the measured state includes information that is representative of dimensions of a non-yielding peripheral portion of the particular substrate.

5. The method according to claim 4, wherein the measured state includes one or more of: a radius, an eccentricity, an out-of-roundness, a width of the border region, an inner border region profile.

6. The method according to claim 1, wherein the pattern information includes pattern layout information that is representative of:

a division of the representative substrate into a plurality of full fields and a plurality of partial fields that surround the plurality of full fields and each partial field is bounded by the border region and by one or more of the full fields;

wherein each full field among the plurality of full fields represents a particular portion of the particular substrate that is to be imprinted with the template; and wherein each partial field among the plurality of partial fields represents a particular portion of the particular substrate that is to be imprinted with a portion of the template that intersects with the border region.

7. The method according to claim 6, wherein the generating the drop pattern information comprises:

generating a full field drop pattern that represents a plurality of positions to place droplets of the formable material on a representative full field that fills a volume between the template and the representative full field and the formable material does not spread beyond the representative full field during imprinting; and generating a plurality of partial field drop patterns, wherein each partial field drop pattern is generated by modifying the full field drop pattern based on the offset information to determine the intersection of the border region of the particular substrate with each partial field drop pattern.

8. The method according to claim 7, wherein modifying the full field drop pattern to generate each partial drop pattern includes cropping the full field drop pattern at the intersection of the border region with each partial field on the particular substrate.

9. The method according to claim 8, wherein modifying the full field drop pattern to generate each partial drop pattern further includes, in a region of the partial field that is adjacent to the border region, one or more of: adding droplets; removing droplets; and moving droplets.

10. The method according to claim 1, wherein the pattern information includes pattern layout information that is representative of:

a division of the representative substrate into a plurality of full fields and a plurality of partial fields that surround the plurality of full fields and are bounded one side by intersection of the border region and by one or more of the full fields;

wherein each full field among the plurality of full fields has a similar full pattern; and wherein each partial field among the plurality of partial fields represents a particular portion of the particular substrate that has a portion of the full pattern that intersects with the border region.

11. The method according to claim 10, wherein the generating the drop pattern information comprises:

generating a full field drop pattern that represents a plurality of positions to place droplets of the formable material on a representative full field that fills a volume between the template and the representative full field; and generating a plurality of partial field drop patterns, wherein each partial field drop pattern is generated by modifying the full field drop pattern based on the offset information to determine the intersection of the border region of the particular substrate with each partial field drop pattern;

wherein the formable material does not spread into the border region during imprinting.

12. The method according to claim 11, wherein modifying the full field drop pattern to generate each partial drop pattern includes cropping the full field drop pattern at the intersection of the border region with each partial field on the particular substrate.

13. The method according to claim 12, wherein modifying the full field drop pattern to generate each partial drop pattern further includes, in a region of the partial field that is adjacent to the border region, one or more of: adding droplets; removing droplets; and moving droplets.

14. The method according to claim 1, wherein the substrate pattern is topography of the substrate to which the template is aligned during an imprinting process and the offset information includes a position of the substrate topography relative to one of a center of the particular substrate and a center of a layer on the substrate.

15. The method according to claim 1, wherein the offset information is based on alignments of the template with the substrate pattern of the particular substrate in a plurality of full fields.

16. The method according to claim 1, wherein the template pattern is featureless.

17. The method according to claim 1, wherein the measured state includes information that is representative of a measured extent of a topmost film on the particular substrate relative to a reference edge of the representative substrate.

18. A method of manufacturing articles using the method of claim 1, the method of manufacturing articles comprising:
contacting the formable material with the template;
curing the formable material under the template so as to form cured formable material on the substrate; and
processing the substrate with the cured formable material so as to manufacture the articles.

19. A system for shaping a film on a substrate comprising:
a processor configured to generate drop pattern information, comprising:

receiving pattern information that includes one or both of:
- a substrate pattern of a representative substrate; and
- a template pattern of a representative template;

receiving offset information about the particular substrate that is representative of a measured state of multiple of fields on the particular substrate relative to a reference state;

wherein drop pattern information represents a plurality of positions to place droplets of formable material onto a particular partial field of the particular substrate;

generating the drop pattern information that is representative of the formable material that fills a volume between the template and the particular substrate that is in the measured state and the formable material does not spread into a border region at an edge of the particular substrate;

a template chuck configured to hold a template;
a substrate chuck configured to hold a particular substrate;
a fluid dispenser configured to dispense formable material on the particular substrate in accordance with the drop pattern information;
a positioning system configured to contact the formable material with the template in the template chuck; and
a curing system configured to cure the formable material under the template so as to form cured formable material on the substrate.

* * * * *